(12) United States Patent
Shon et al.

(10) Patent No.: US 8,866,524 B2
(45) Date of Patent: Oct. 21, 2014

(54) SEMICONDUCTOR DEVICE HAVING OUTPUT CIRCUIT AND OPERATING METHOD THEREOF

(71) Applicant: SK hynix Inc., Gyeonggi-do (KR)

(72) Inventors: Kwan-Su Shon, Gyeonggi-do (KR); Taek-Sang Song, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/844,861

(22) Filed: Mar. 16, 2013

(65) Prior Publication Data

US 2014/0176197 A1    Jun. 26, 2014

(30) Foreign Application Priority Data

Dec. 20, 2012    (KR) .................... 10-2012-0150008

(51) Int. Cl.
*H03K 5/12*    (2006.01)
*H03K 3/01*    (2006.01)

(52) U.S. Cl.
CPC ........................................ *H03K 3/01* (2013.01)
USPC ........................... 327/170; 327/263; 327/276

(58) Field of Classification Search
USPC ..................... 327/108, 170, 263–264, 277; 326/82–83, 86–87
See application file for complete search history.

(56) References Cited

U.S. PATENT DOCUMENTS 7,598,772 B2 * 10/2009 Young .............................. 326/83
7,719,314 B1 * 5/2010 Jiang et al. ..................... 326/83
8,324,947 B2 * 12/2012 Ichikawa ....................... 327/170
2005/0001653 A1    1/2005 Ahmad

FOREIGN PATENT DOCUMENTS

KR    1020030079297    10/2003

\* cited by examiner

*Primary Examiner* — An Luu
(74) *Attorney, Agent, or Firm* — IP & T Group LLP

(57) ABSTRACT

A semiconductor device includes a plurality of driving units configured to drive an output node based on an input signal and be on/off controlled based on driving force control codes, respectively, a slew rate control signal generation block configured to generate a slew rate control signal based on the driving force control codes, and a plurality of signal delay units configured to delay the input signal by respectively different delay amounts, transfer resultant signals to the plurality of driving units, and be respectively controlled in their delay amounts based on the slew rate control signal.

18 Claims, 11 Drawing Sheets

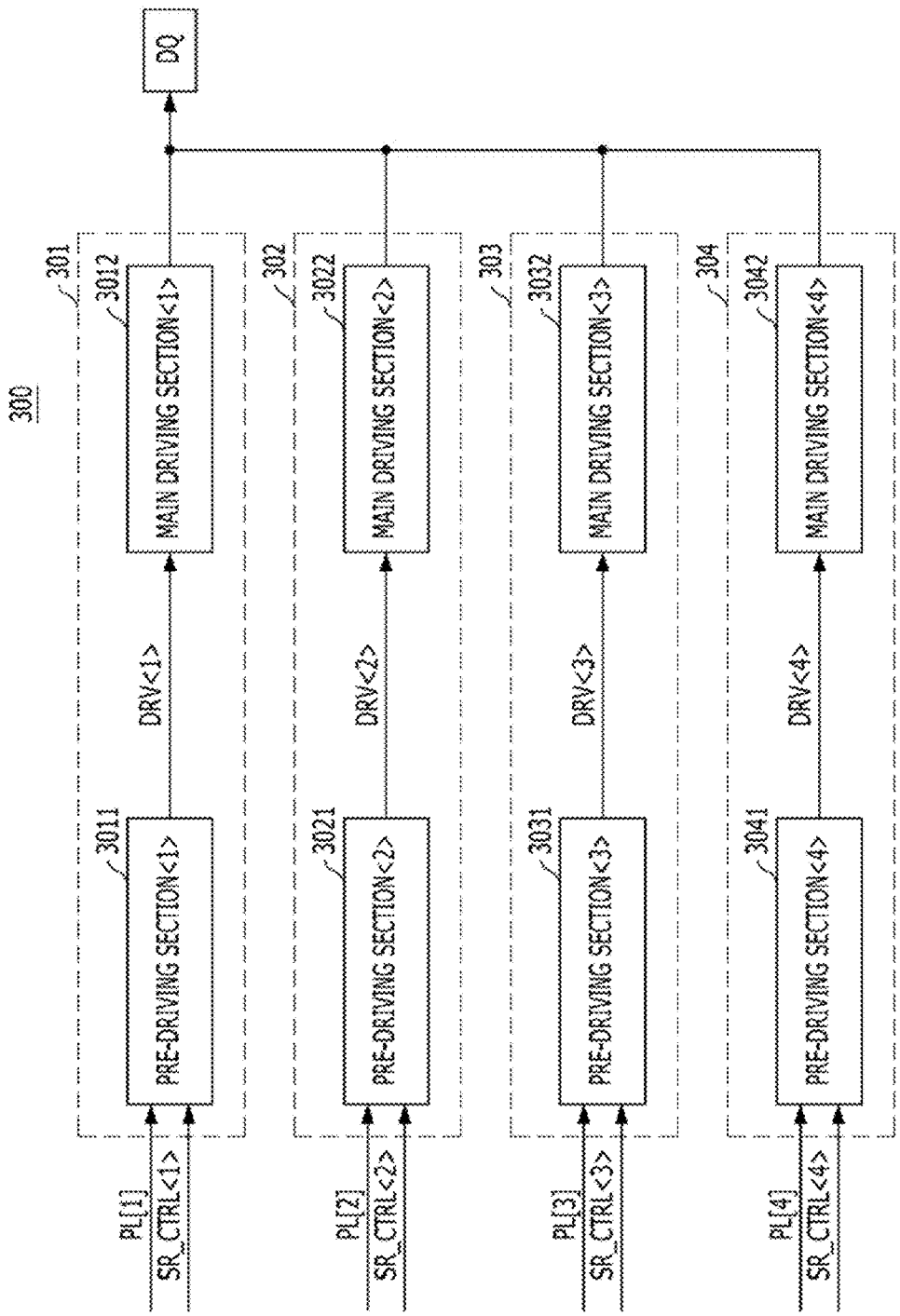

SEMICONDUCTOR DEVICE HAVING OUTPUT CIRCUIT AND OPERATING METHOD THEREOF

CROSS-REFERENCE TO RELATED APPLICATIONS

The present application claims priority of Korean Patent Application No. 10-2012-0150008, filed on Dec. 20, 2012, which is incorporated herein by reference in its entirety.

BACKGROUND

1. Field

Exemplary embodiments of the present invention relate to a semiconductor design technology, and more particularly, to an output circuit of semiconductor device.

2. Description of the Related Art

In general, in a low-power semiconductor device (i.e., designed to operate under low power condition), an output circuit is desirable to reduce power consumption, and due to this fact, it may be difficult to secure signal integrity of output signal.

For example, in a main memory or a graphic memory, which has no limitation in terms of power consumption, a termination control circuit such as an on-die termination (ODT) circuit is included to be connected to a data output terminal to suppress reflective waves when transmitting data, thereby securing the signal integrity of output data signal. However, although such termination control circuit provides an advantage in that the reflective waves may be effectively removed, constant DC current may be required to be consumed by termination resistor. Due to such a concern, the termination control circuit may not be employed to a semiconductor device in a mobile system, which should operate under low power condition.

FIG. 1 is a block diagram illustrating a data output circuit of a conventional low-power semiconductor device.

Referring to FIG. 1, the data output circuit includes a pull-up operation block 100, and a pull-down operation block 120.

The pull-up operation block 100 drives an output node DQ to a logic high level, corresponding to a power supply voltage (VDD), based on a logic high level of an input signal IN_SIG.

The pull-down operation block 120 drives the output node DQ to a logic low level, corresponding to a ground voltage (VSS), based on a logic low level of the input signal IN_SIG.

The pull-up operation block 100 includes a plurality of pull-up driving units 104, 105, 106 and 107. Operations of the plurality of pull-up driving units 104, 105, 106 and 107 are on/off controlled based on driving force control codes SR_CTRL<1:4>. For reference, while it is exemplified in the drawing for the sake of convenience in explanation that a first pull-up driving unit 104, a second pull-up driving unit 105, a third pull-up driving unit 106 and a fourth pull-up driving unit 107 are included in the plurality of pull-up driving units 104, 105, 106 and 107, configuration may be actually made such that an increased or decreased number of pull-up driving units may be included in the plurality of pull-up driving units 104, 105, 106 and 107. Also, while it is exemplified that the driving force control codes SR_CTRL<1:4> are a signal which is constituted by 4 bits, it is to be noted that driving force control codes may actually be a signal which is constituted by an increased or decreased number of bits.

The pull-down operation block 120 includes a plurality of pull-down driving units 124, 125, 126 and 127. Operations of the plurality of pull-down driving units 124, 125, 126 and 127 are on/off controlled based on the driving force control codes SR_CTRL<1:4>. For reference, while it is exemplified in the drawing for the sake of convenience in explanation that a first pull-down driving unit 124, a second pull-down driving unit 125, a third pull-down driving unit 126 and a fourth pull-down driving unit 127 are included in the plurality of pull-down driving units 124, 125, 126 and 127, configuration may be actually made such that an increased or decreased number of pull-down driving units may be included in the plurality of pull-down driving units 124, 125, 126 and 127. Also, while it is exemplified that the driving force control codes SR_CTRL<1:4> are a signal which is constituted by 4 bits, it is to be noted that driving force control codes may actually be a signal which is constituted by an increased or decreased number of bits.

The reason why the plurality of pull-up driving units 104, 105, 106 and 107 are included in the pull-up operation block 100 and the plurality of pull-down driving units 124, 125, 126 and 127 are included in the pull-down operation block 120 as in the above-described configuration resides in that, because the conventional semiconductor device is a low-power semiconductor device, in which a separate termination control circuit such as an ODT circuit may not be included. That is to say, instead of controlling the impedance matching of the output node DQ through a separate termination control circuit such as an ODT circuit, the impedance matching of the output node DQ is controlled through a scheme of controlling the driving force of an output driver. As a scheme for controlling the driving forces of the pull-up operation block 100 and the pull-down operation block 120, a method of controlling the value of the driving force control codes SR_CTRL<1:4> is used as exemplified in the following descriptions. The values of the driving force control codes SR_CTRL<1:4> may be defined in advance through an operation setting circuit in the semiconductor device, such as a memory register set (MRS), or by receiving values from an outside of the semiconductor device.

For example, it is assumed that output impedance of the output node DQ in view of single driving unit included in the pull-up operation block 100 and the pull-down operation block 120 is 120Ω. when only the first bit of the driving force control code SR_CTRL<1> is activated and the second to fourth bits of the driving force control codes SR_CTRL<2:4> are deactivated and thus only the first pull-up driving unit 104 operates and the second to fourth pull-up driving units 105, 106 and 107 do not operate, the output impedance of the output node DQ becomes 120Ω. When only the first and second bits of the driving force control codes SR_CTRL<1:2> are activated and the third and fourth bits of the driving force control codes SR_CTRL<3:4> are deactivated among the driving force control codes SR_CTRL<1:4> and thus only the first and second pull-up driving units 104 and 105 operate and the third and fourth pull-up driving units 106 and 107 do not operate, the output impedance of the output node DQ becomes 60Ω. When only the first to third bits of the driving force control code SR_CTRL<1:3> are activated and the fourth bit of the driving force control code SR_CTRL<4> is deactivated, and thus the first to third pull-up driving units 104, 105 and 106 operate and the fourth pull-up driving unit 107 does not operate, the output impedance of the output node DQ becomes 40Ω. When all the bits of the driving force control codes SR_CTRL<1:4> are activated, and thus all the first to fourth pull-up driving units 104, 105, 106 and 107 operate, the output impedance of the output node DQ becomes 30Ω.

In the same manner, it is assumed that output impedance of the output node DQ in view of single driving unit included in the pull-down operation block 120 is 120Ω, when only the first bit of the driving force control code SR_CTRL<1> is activated and the second to fourth bits of the driving force control code SR_CTRL<2:4> are deactivated and thus only the first pull-down driving unit 124 operates and the second to fourth pull-down driving units 125, 126 and 127 do not operate, the output impedance of the output node DQ becomes 120Ω. When only the first and second bits of the driving force control code SR_CTRL<1:2> are activated and the third and fourth bits of the driving force control code SR_CTRL<3:4> are deactivated among the driving force control codes SR_CTRL<1:4>, and thus only the first and second pull-down driving units 124 and 125 operate and the third and fourth pull-down driving units 126 and 127 do not operate, the output impedance of the output node DQ becomes 60Ω. When only the first to third bits of the driving force control code SR_CTRL<1:3> are activated and the fourth bit of the driving force control code SR_CTRL<4> is deactivated and thus only the first to third pull-down driving units 124, 125 and 126 operate and the fourth pull-down driving unit 127 does not operate, the output impedance of the output node DQ becomes 40Ω. When all the bits of the driving force control codes SR_CTRL<1:4> are activated, and thus all the first to fourth pull-down driving units 124, 125, 126 and 127 operate, the output impedance of the output node DQ becomes 30Ω.

However, when the impedance matching of the output node DQ is controlled by controlling a driving force of an output driver as in the above-described conventional semiconductor device, a slope is likely to become gentle due to inter-symbol interference (hereafter, referred to as 'ISI') among output signals, and a problem may be caused in that a data eye is narrowed or is even closed.

FIG. 2 is of diagrams for explaining ISI occurred in the data output circuit shown in FIG. 1.

Referring to FIG. 2, in the conventional data output circuit of a low-power semiconductor device, as the output impedance of the output node DQ for impedance matching is small, ISI occurs less and a slope retains a relatively steep state, and due to this fact, a data eye is sufficiently secured. On the contrary, as the output impedance of the output node DQ for impedance matching is large, ISI occurs more and a slope retains a relatively gentle state, and due to this fact, a data eye is not sufficiently secured.

In detail, when the output impedance of the output node DQ for impedance matching is 34Ω, a data eye becomes 471 p and a data eye is sufficiently secured.

When the output impedance of the output node DQ for impedance matching is 40Ω, a data eye becomes, for example, '329 ps'. When the output impedance of the output node DQ for impedance matching is 48Ω, a data eye becomes '257 ps'. When the output impedance of the output node DQ for impedance matching is 60Ω, a data eye becomes '25.8 ps'. Thus, as the output impedance of the output node DQ increases, the magnitude of a data eye abruptly decreases.

As a consequence, the fact that a data eye of a signal outputted from a data output circuit is not sufficiently secured is directly connected with a problem of deteriorating the reliability of the output signal, which leads to a problem that a data output operation may not be normally performed. Further, because these problems exert greater influences when a low-power semiconductor device is to operate at a high speed, a serious concern may be caused when considering a technology trend toward a high speed semiconductor device.

SUMMARY

Various embodiments of the present invention are directed to a data output circuit of a low-power semiconductor device that may secure signal integrity of data signal without being assisted by termination control circuit.

In an embodiment, a semiconductor device includes a plurality of driving units configured to drive an output node based on an input signal and be on/off controlled based on driving force control codes, respectively, a slew rate control signal generation block configured to generate a slew rate control signal based on the driving force control codes, and a plurality of signal delay units configured to delay the input signal by respectively different delay amounts, transfer resultant signals to the plurality of driving units, and be respectively controlled in their delay amounts based on the slew rate control signal.

In an embodiment, a semiconductor device includes a plurality of first driving units configured to drive an output node based on an input signal with a first logic level, and be on/off controlled based on driving force control codes, respectively, a plurality of second driving units configured to drive the output node based on the input signal with a second logic level, and be on/off controlled based on the driving force control codes, respectively, a slew rate control signal generation block configured to generate a slew rate control signal based on the driving force control codes, a plurality of first signal delay units configured to delay the input signal with the first logic level by respectively different delay amounts, transfer resultant signals to the plurality of first driving units, and be respectively controlled in their delay amounts based on the slew rate control signal, and a plurality of second signal delay units configured to delay the input signal with the second logic level by respectively different delay amounts, transfer resultant signals to the plurality of second driving units, and be respectively controlled in their delay amounts based on the slew rate control signal.

In an embodiment, an operating method of a semiconductor device includes a slew rate control operation of delaying an input signal by a plurality of different delay amounts, outputting a plurality of delayed input signals, and controlling the plurality of delay amounts based on driving force control codes, and a driving force control operation of selecting a predetermined number of delayed input signals among the plurality of delayed input signals based on the driving force control codes, and driving an output node in response in parallel to the selected signals.

In accordance with the embodiments of the present invention, a slew rate may be controlled based on the driving force of an output signal even in a low-power semiconductor device without a separate termination control circuit such as an ODT circuit, whereby it may be possible to secure a data eye. That is to say, the reliability of an output signal may be significantly improved.

As a consequence, in the low-power semiconductor device without a separate termination control circuit such as an ODT circuit, an impedance matching operation may be performed over a wide range.

BRIEF DESCRIPTION OF THE DRAWINGS

FIGS. 3B and 3C are detailed diagrams illustrating a driving operation block shown in FIG. 3A, respectively.

DETAILED DESCRIPTION

Figure 1:
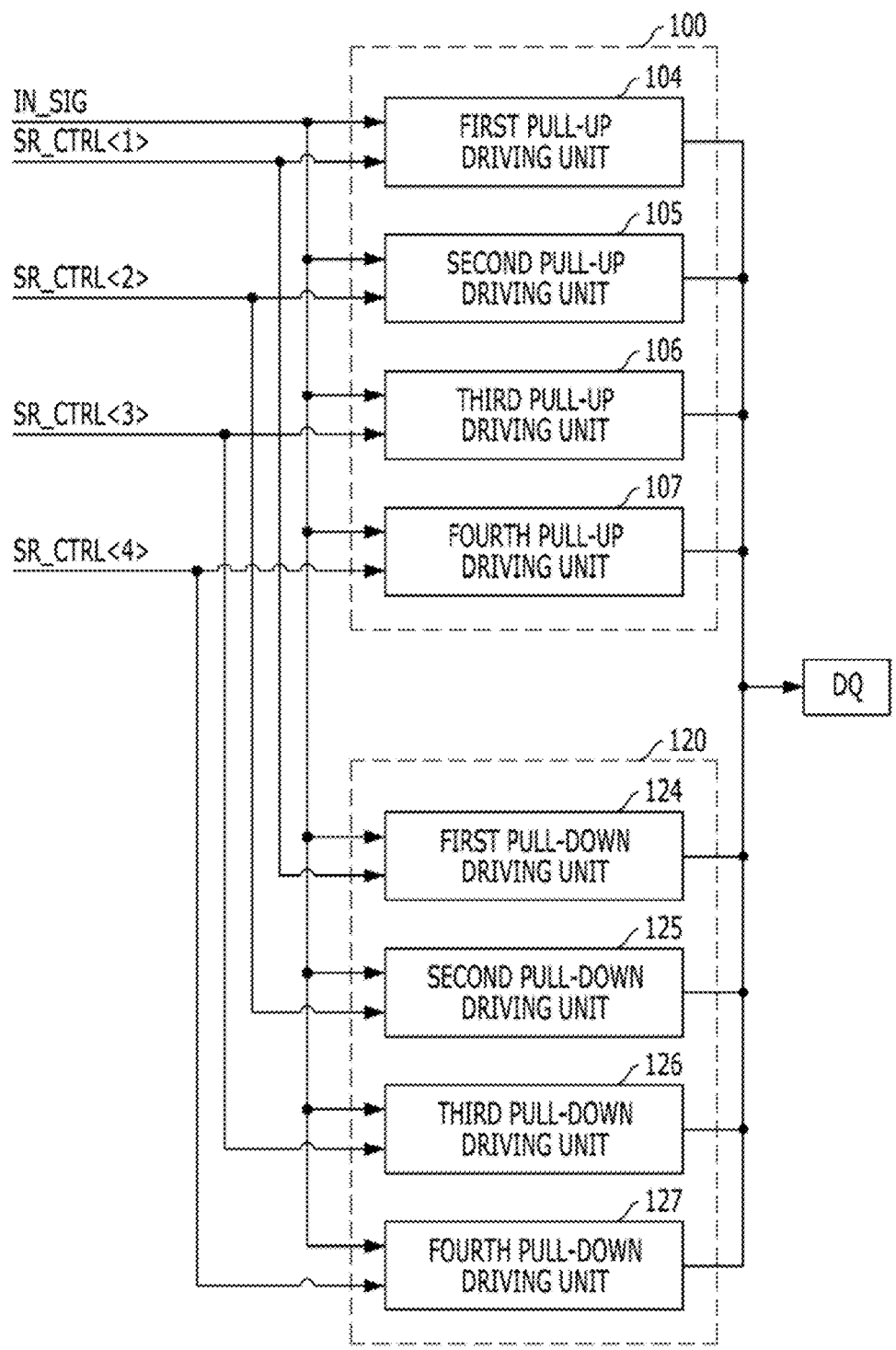
FIG. 1 is a block diagram illustrating a data output circuit of a conventional low-power semiconductor device.
Figure 2:
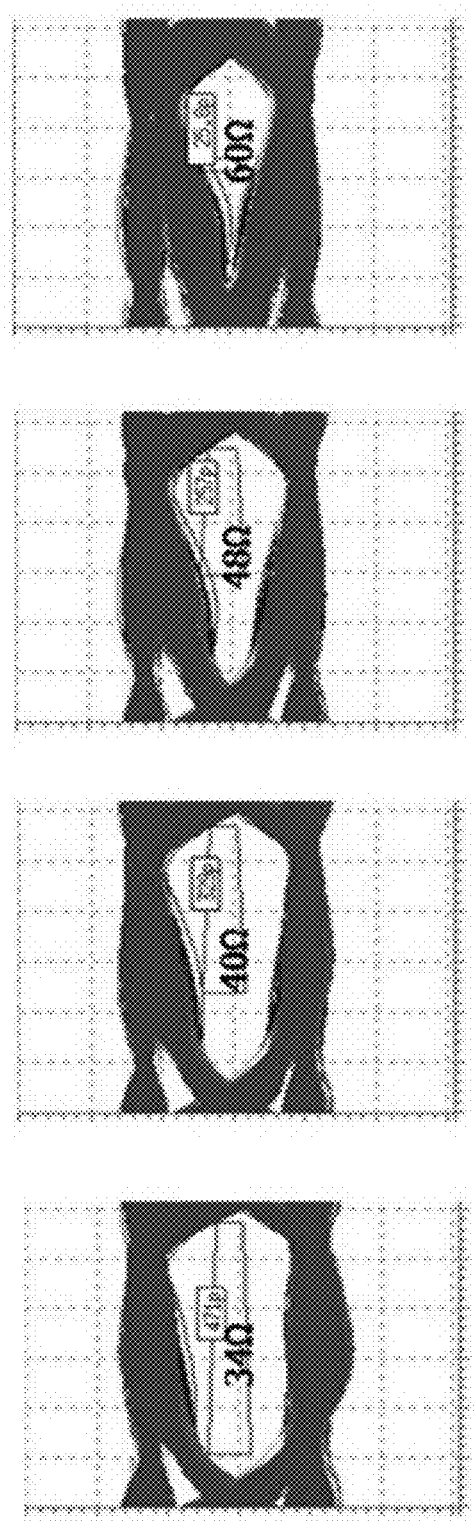
FIG. 2 is diagrams for explaining inter-symbol interference (ISI) occurred in the data output circuit shown in FIG. 1.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence.

First Embodiment

Figure 3A:
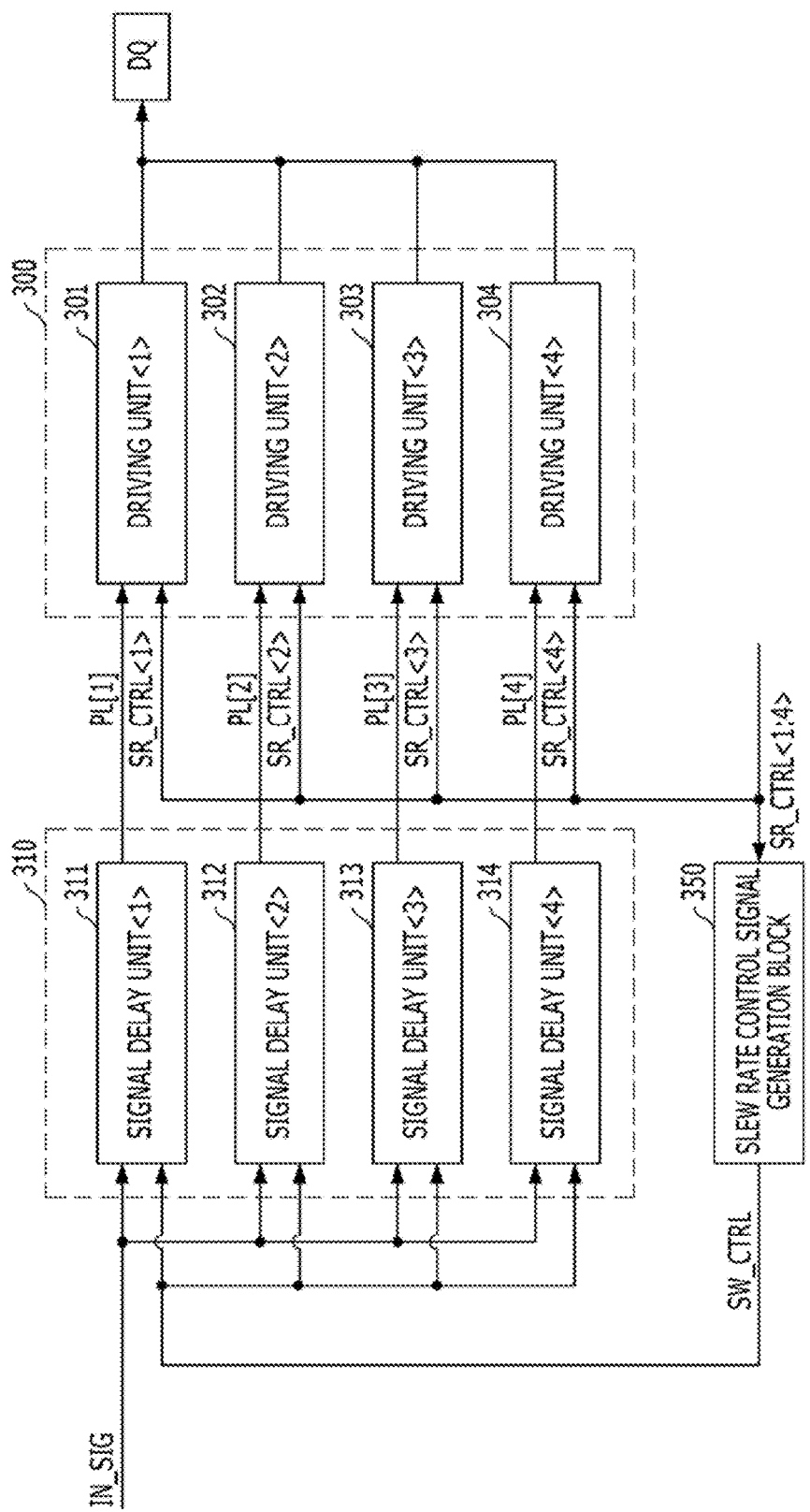
FIG. 3A is a block diagram illustrating a data output circuit of a low-power semiconductor device, in accordance with a first embodiment of the present invention.

FIG. 3A is a block diagram illustrating a data output circuit of a low-power semiconductor device, in accordance with a first embodiment of the present invention.

Referring to FIG. 3A, the data output circuit of the low-power semiconductor device, in accordance with a first embodiment of the present invention, includes a driving operation block 300, and slew rate control blocks 310 and 350. The slew rate control blocks 310 and 350 include a signal delay operation block 310, and a slew rate control signal generation block 350.

The driving operation block 300 is configured to drive an output node DQ to a logic high level, corresponding to a power supply voltage (VDD), based on logic high levels of inputted signals PL[1:4], and drive the output node DQ to a logic low level, corresponding to a ground voltage (VSS), based on logic low levels of the inputted signals PL[1:4].

The driving operation block 300 includes a plurality of driving units 301, 302, 303 and 304. The plurality of driving units 301, 302, 303 and 304 are configured to drive the output node DQ based on the Inputted signals PL[1:4], and operations of the plurality of driving units 301, 302, 303 and 304 are on/off controlled based on driving force control codes SR_CTRL<1:4>. For reference, while it is exemplified in the drawing for the sake of convenience in explanation that a first driving unit 301, a second driving unit 302, a third driving unit 303 and a fourth driving unit 304 are included in the plurality of driving units 301, 302, 303 and 304, configuration may be actually made such that an increased or decreased number of driving units may be included in the plurality of driving units 301, 302, 303 and 304. Also, while it is exemplified that the driving force control codes SR_CTRL<1:4> are a signal which is constituted by 4 bits, it is to be noted that driving force control codes may actually be a signal which is constituted by an increased or decreased number of bits.

The reason why the plurality of driving units 301, 302, 303 and 304 are included in the driving operation block 300 as in the above-described configuration resides in that, because the semiconductor device in accordance with the first embodiment of the present invention is a low-power semiconductor device, a separate termination control circuit such as an ODT circuit may not be included. That is to say, instead of controlling the impedance matching of the output node DQ through a separate termination control circuit such as an ODT circuit, the impedance matching of the output node DQ is controlled through a scheme of controlling the driving force of an output driver. As a scheme for controlling the driving force of the driving operation block 300, a method of controlling the value of the driving force control codes SR_CTRL<1:4> is used as exemplified in the following descriptions. The values of the driving force control codes SR_CTRL<1:4> may be defined in advance through an operation setting circuit in the semiconductor device, such as a memory register set (MRS), or by receiving values from an outside of the semiconductor device.

For example, it is assumed that output impedance of the output node DQ in view of single driving unit included in the driving operation block 300 is 120Ω, when only the first bit of the driving force control code SR_CTRL<1> is activated and the second to fourth bits of the driving force control code SR_CTRL<2:4> are deactivated and thus only the first driving unit 301 operates and the second to fourth driving units 302, 303 and 304 do not operate, the output impedance of the output node DQ becomes 120Ω. When only the first and second bits of the driving force control code SR_CTRL<1:2> are activated and the third and fourth bits of the driving force control code SR_CTRL<3:4> are deactivated among the driving force control codes SR_CTRL<1:4>, and thus only the first and second driving units 301 and 302 operate and the third and fourth driving units 303 and do not operate, the output impedance of the output node DQ becomes 60Ω. When only the first to third bits of the driving force control code SR_CTRL<1:3> are activated and the fourth bit of the driving force control code SR_CTRL<4> is deactivated and thus only the first to third driving units 301, 302 and 303 operate and the fourth driving unit 304 does not operate, the output impedance of the output node DQ becomes 40Ω. When all the bits of the driving force control codes SR_CTRL<1:4> are activated, and thus all the first to fourth driving units 301, 302, 303 and 304 operate, the output impedance of the output node DQ becomes 30Ω. For reference, in the above descriptions, the output impedance of the output node DQ in view of single driving unit may have a different value according to a design.

The slew rate control blocks 310 and 350 are configured to control the slew rate of a signal which is loaded on the output node DQ, based on the driving force control codes SR_CTRL<1:4>. In other words, the slew rate control blocks 310 and 350 control the slew rate of an input signal IN_SIG based on the driving force control codes SR_CTRL<1:4> and transfer the signals PL[1:4] to the driving operation block 300, thereby controlling the slew rate of the signal which is loaded on the output node DQ, through the driving operation block 300.

The slew rate control signal generation block 350 between the components of the slew rate control blocks 310 and 350 is configured to generate a slew rate control signal SW_CTRL based on the driving force control codes SR_CTRL<1:4>.

Schemes for generating the slew rate control signal SW_CTRL based on the value of the driving force control codes SR_CTRL<1:4> in the slew rate control signal generation block 350 may be explained through the following two exemplifications.

A first scheme is the case where it is assumed that the slew rate control signal SW_CTRL outputted from the slew rate control signal generation block 350 is a signal which is constituted by one bit. In this case, when the number of bits activated among the driving force control codes SR_CTRL<1:4> is equal to or larger than a preset number, the slew rate control signal SW_CTRL is outputted by being activated. Conversely, when the number of bits activated among the driving force control codes SR_CTRL<1:4> is smaller than the preset number, the slew rate control signal SW_CTRL is outputted by being deactivated.

For example, assuming that the preset number is 2, when the driving force control codes SR_CTRL<1:4> are '1000', '0100', '0010' or '0001' such that the number of bits activated among the driving force control codes SR_CTRL<1:4> is smaller than 2, the slew rate control signal SW_CTRL may be outputted by being deactivated, and, when the driving force control codes SR_CTRL<1:4> are '1100', '0110', '0011', '1001', '1010', '0101', '1110', '0111', '1011', '1101', '0111' or '1111' such that the number of bits activated among the driving force control codes SR_CTRL<1:4> is equal to or larger than 2, the slew rate control signal SW_CTRL may be outputted by being activated.

A second scheme is the case where it is assumed that the slew rate control signal SW_CTRL outputted from the slew rate control signal generation block 350 is a signal which is constituted by a plurality of bits. In this case, the more the number of bits activated among the driving force control codes SR_CTRL<1:4> increases, the more the slew rate control signal SW_CTRL is outputted by being increased in its value. Conversely, the more the number of bits activated among the driving force control codes SR_CTRL<1:4> decreases, the more the slew rate control signal SW_CTRL is outputted by being decreased in its value.

For example, setting is made such that the value of the driving force control codes SR_CTRL<1:4> when the driving force control codes SR_CTRL<1:4> are '0101' is larger than the value of the driving force control codes SR_CTRL<1:4> when the driving force control codes SR_CTRL<1:4> are '0001', and the value of the driving force control codes SR_CTRL<1:4> when the driving force control codes SR_CTRL<1:4> are '1110' is larger than the value of the driving force control codes SR_CTRL<1:4> when the driving force control codes SR_CTRL<1:4> are '0101'.

In this way, while the concrete schemes may be changed according to whether the slew rate control signal SW_CTRL outputted from the slew rate control signal generation block 350 is a signal which is constituted by one bit or a signal which is constituted by a plurality of bits, the two schemes are the same with each other in that the value of the slew rate control signal SW_CTRL is controlled based on the value of the driving force control codes SR_CTRL<1:4>. In this regard, since the configuration for generating the slew rate control signal SW_CTRL according to the first scheme is easier and simpler to explain than the second scheme, the following descriptions will be made on the assumption that the slew rate control signal SW_CTRL is a signal which is constituted by one bit.

The signal delay operation block 310 between the components of the slew rate control blocks 310 and 350 includes a plurality of signal delay units 311, 312, 313 and 314. The plurality of signal delay units 311, 312, 313 and 314 are configured to delay the input signal IN_SIG by different delay amounts and transfer the signals PL[1:4] to the plurality of driving units 301, 302, 303 and 304. The plurality of signal delay units 311, 312, 313 and 314 are controlled in their delay amounts based on the slew rate control signal SW_CTRL.

The delaying the input signal IN_SIG by different delay amounts and then transferring the signals PL[1:4] to the plurality of driving units 301, 302, 303 and 304 means, for example, that the signal PL[1] transferred to the first driving unit 301 among the plurality of driving units 301, 302, 303 and 304 is less delayed than the signal PL[2] transferred to the second driving unit 302, the signal PL[2] transferred to the second driving unit 302 is less delayed than the signal PL[3] transferred to the third driving unit 303, and the signal PL[3] transferred to the third driving unit 303 is less delayed than the signal PL[4] transferred to the fourth driving unit 304.

The more a difference among the delay amounts of the signals PL[1:4] respectively transferred to the plurality of driving units 301, 302, 303 and 304 is large, the more the slew rate of the signal which is loaded on the output node DQ by the plurality of driving units 301, 302, 303 and 304 decreases. Conversely, the more a difference among the delay amounts of the signals PL[1:4] respectively transferred to the plurality of driving units 301, 302, 303 and 304 is small, the more the slew rate of the signal which is loaded on the output node DQ by the plurality of driving units 301, 302, 303 and 304 increases. For reference, the fact that the slew rate of the signal which is loaded on the output node DQ decreases means that the slope of the signal which is loaded on the output node DQ becomes relatively gentle. Conversely, the fact that the slew rate of the signal which is loaded on the output node DQ increases means that the slope of the signal which is loaded on the output node DQ becomes relatively steep.

The reason why the plurality of signal delay units 311, 312, 313 and 314 are included in the signal delay operation block 310 as in the above-described configuration is because the plurality of driving units 301, 302, 303 and 304 are included in the driving operation block 300. Namely, in order to delay the input signal IN_SIG by the different delay amounts and transfer the signals PL[1:4] to the plurality of driving units 301, 302, 303 and 304, the same number of the plurality of signal delay units 311, 312, 313 and 314 as the plurality of driving units 301, 302, 303 and 304 should be included. Therefore, if the number of the plurality of driving units 301, 302, 303 and 304 included in the driving operation block 300 is larger or smaller than 4 unlike illustration of the drawing, the number of the plurality of signal delay units 311, 312, 313 and 314 included in the signal delay operation block 310 should be larger or smaller than 4 in correspondence to the number of the plurality of driving units 301, 302, 303 and 304.

In summary, when the number of bits which are activated among the driving force control codes SR_CTRL<1:4> Is relatively large and the number of driving units which perform driving operations, among the plurality of driving units 301, 302, 303 and 304 included in the driving operation block 300, is relatively large, that is, when a driving force by the driving operation block 300 is relatively large, the output impedance of the output node DQ becomes relatively low. In such a case, because it may be not necessary to artificially increase the slew rate of the signal which is loaded on the output node DQ, a delay amount difference among the signals PL[1:4] respectively transferred to the plurality of driving units 301, 302, 303 and 304 by the plurality of signal delay units 311, 312, 313 and 314 as the slew rate control signal SW_CTRL is activated is retained in a normal state.

However, when the number of bits which are activated among the driving force control codes SR_CTRL<1:4> is relatively small and the number of driving units which perform driving operations, among the plurality of driving units 301, 302, 303 and 304 included in the driving operation block 300, is relatively small, that is, when a driving force by the driving operation block 300 is relatively small, the output impedance of the output node DQ becomes relatively high. In such a case, because it may be necessary to artificially increase the slew rate of the signal which is loaded on the output node DQ, a delay amount difference among the signals PL[1:4] respectively transferred to the plurality of driving units 301, 302, 303 and 304 by the plurality of signal delay units 311, 312, 313 and 314 as the slew rate control signal SW_CTRL is deactivated is controlled to a smaller state than the normal state. Thus, the slew rate of the signal which is loaded on the output node DQ is controlled to be higher than the normal state. According to this fact, it may be possible to prevent the occurrence of a phenomenon in which a slope becomes gentle due to ISI among outputted signals, which is caused as the output impedance of the output node DQ increases.

Figure 3C:
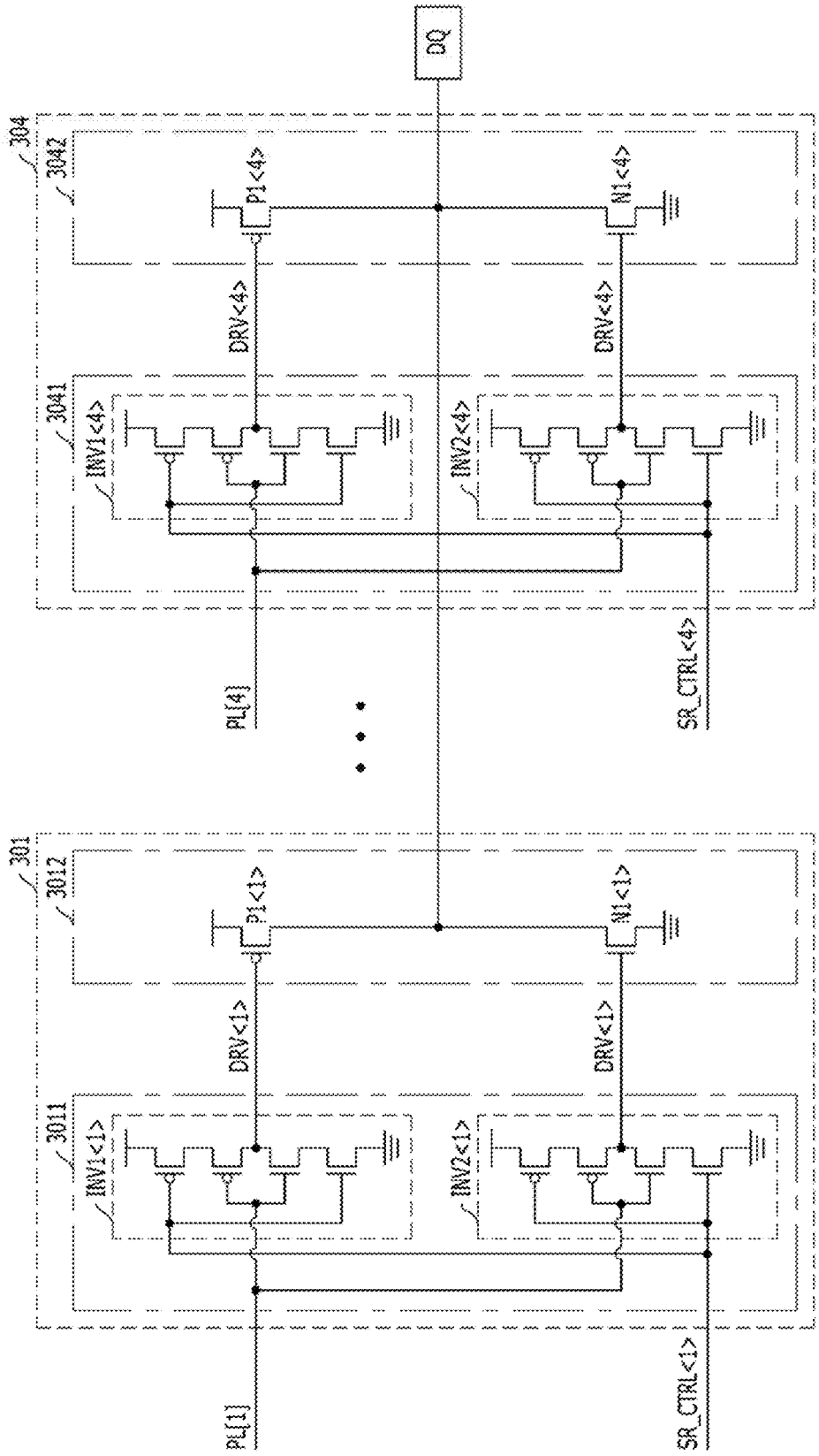

FIGS. 3B and 3C are detailed diagrams illustrating the driving operation block 300 shown in FIG. 3A, respectively.

First, referring to FIG. 3B, FIG. 3B is a block diagram showing the configurations of the plurality of driving units 301, 302, 303 and 304 included in the driving operation block 300 among the components of the data output circuit of a low-power semiconductor device, in accordance with the first embodiment of the present invention.

In detail, the plurality of driving units 301, 302, 303 and 304 include a plurality of pre-driving sections 3011, 3021, 3031 and 3041, and a plurality of main driving sections 3012, 3022, 3032 and 3042. The plurality of pre-driving sections 3011, 3021, 3031 and 3041 are configured to generate a plurality of driving control signals DRV<1:4> based on the delayed input signals PL[1:4] respectively applied through the plurality of signal delay units 311, 312, 313 and 314 and are on/off controlled in their operations based on the driving force control codes SR_CTRL<1:4>. The plurality of main driving sections 3012, 3022, 3032 and 3042 are configured to drive the output node DQ based on the plurality of driving control signals DRV<1:4>, respectively.

Further, referring to FIG. 3C, FIG. 3C is a detailed circuit diagram showing the configurations of the plurality of driving units 301, 302, 303 and 304 included in the driving operation block 300 among the components of the data output circuit of a low-power semiconductor device, in accordance with the first embodiment of the present invention.

In detail, the plurality of pre-driving sections 3011, 3021, and 3041 respectively include two inverters INV1<1:4> and INV2<1:4> to output the plurality of driving control signals DRV<1:4> with logic low levels based on logic high levels of the plurality of delayed input signals PL[1:4] and output the plurality of driving control signals DRV<1:4> with logic high levels based on logic low levels of the plurality of delayed input signals PL[1:4]. The two inverters INV1<1:4> and INV2<1:4> respectively included in the plurality of pre-driving sections 3011, 3021, 3031 and 3041 are respectively on/off controlled in their operations based on the plurality of driving force control codes SR_CTRL<1:4>.

Further, the plurality of main driving sections 3012, 3022, 3032 and 3042 respectively include PMOS transistors P1<1:4> to drive the output node DQ to the logic high level corresponding to the power supply voltage (VDD) based on the logic low levels of the plurality of driving control signals DRV<1:4>, and NMOS transistors N1<1:4> to drive the output node DQ to the logic low level corresponding to the ground voltage (VSS) based on the logic high levels of the plurality of driving control signals DRV<1:4>.

Figure 3D:
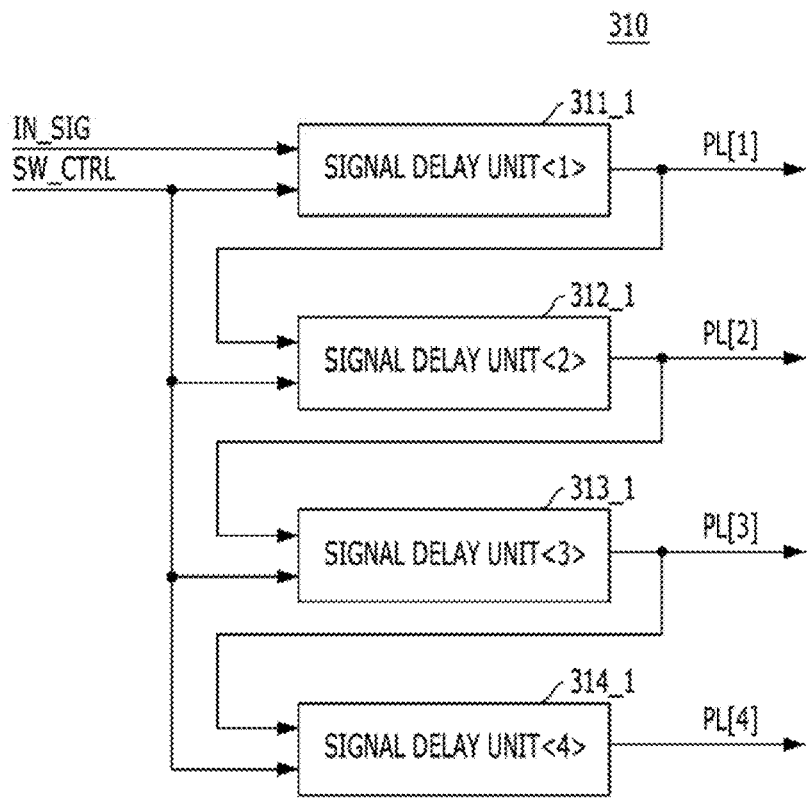
FIG. 3D is a detailed diagram an additional embodiment of a signal delay operation block shown in FIG. 3A.
Figure 3E:
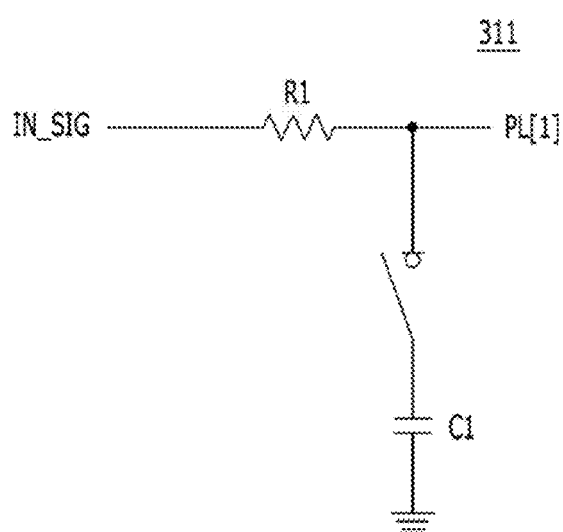
FIG. 3E is a detailed diagram illustrating a single signal delay unit shown in FIGS. 3A and 3D.

FIG. 3D is a detailed diagram illustrating an additional embodiment of the signal delay operation block 310 shown in FIG. 3A, and FIG. 3E is a detailed diagram illustrating the single signal delay unit shown in FIGS. 3A and 3D.

Referring to FIGS. 3A and 3D, two configurations of the plurality of signal delay units included in the signal delay operation block 310 among the components of the data output circuit are different from each other.

First, the plurality of signal delay units 311, 312, 313 and 314 shown in FIG. 3A are configured to receive in parallel and delay the input signal IN_SIG, transfer the signals PL[1:4] to the plurality of respective driving units 301, 302, 303 and 304, and be controlled in their delay amounts based on the slew rate control signal SW_CTRL.

Second, the plurality of signal delay units 311_1, 312_1, 313_1 and 314_1 shown in FIG. 3D are connected in series in a preset order and are configured to receive the input signal IN_SIG through the foremost signal delay unit 311, delay the input signal IN_SIG and the signals PL[1:3] in a stepwise manner, transfer the signals PL[1:4] to the plurality of respective driving units 301, 302, and 304, and be controlled in their delay amounts based on the slew rate control signal SW_CTRL.

By using the fact that the connection styles of the plurality of signal delay units are different in this way, the delay amount of the plurality of signal delay units may be differently set.

That is to say, when the plurality of signal delay units 311, 312, 313 and 314 are configured as shown in FIG. 3A, only when the plurality of signal delay units 311, 312, 313 and 314 are set with delay amounts independently of one another to have different delay amounts, the plurality of delayed input signals PL[1:4] may be generated while having an appropriate delay amount difference. For example, if the first signal delay unit 311 is set to have a delay amount of '10 ps', the second to fourth signal delay units 312, 313 and 314 should be set to have a delay amount which is larger or smaller than the delay amount of '10 ps'.

Conversely, when the plurality of signal delay units are configured as shown in FIG. 3D, even though the plurality of signal delay units 311_1, 312_1, 313_1 and 314_1 have the same delay amount, the plurality of delayed input signals PL[1:4] may be generated while having an appropriate delay amount difference. For example, if the first signal delay unit 311_1 is set to have a delay amount of '10 ps', the second to fourth signal delay units 312_1, 313_1 and 314_1 may be set to have the delay amount of '10 ps' or a delay amount which is larger or smaller than the delay amount of '10 ps'.

For reference, referring to FIG. 3E, the detailed circuit of each of the plurality of signal delay units 311, 312, 313 and 314 shown in FIG. 3A and the plurality of signal delay units 311_1, 312_1, 313_1 and 314_1 shown in FIG. 3D may be realized through a resistor R1 and a capacitor C1. Moreover, an operation of changing the delay amount of the plurality of signal delay units based on the slew rate control signal SW_CTRL may be realized through a simple switch circuit such as a fuse or a MOS transistor. Since the configuration of FIG. 3E is generally known in the art, detailed descriptions thereof will be omitted herein.

Second Embodiment

Figure 4A:
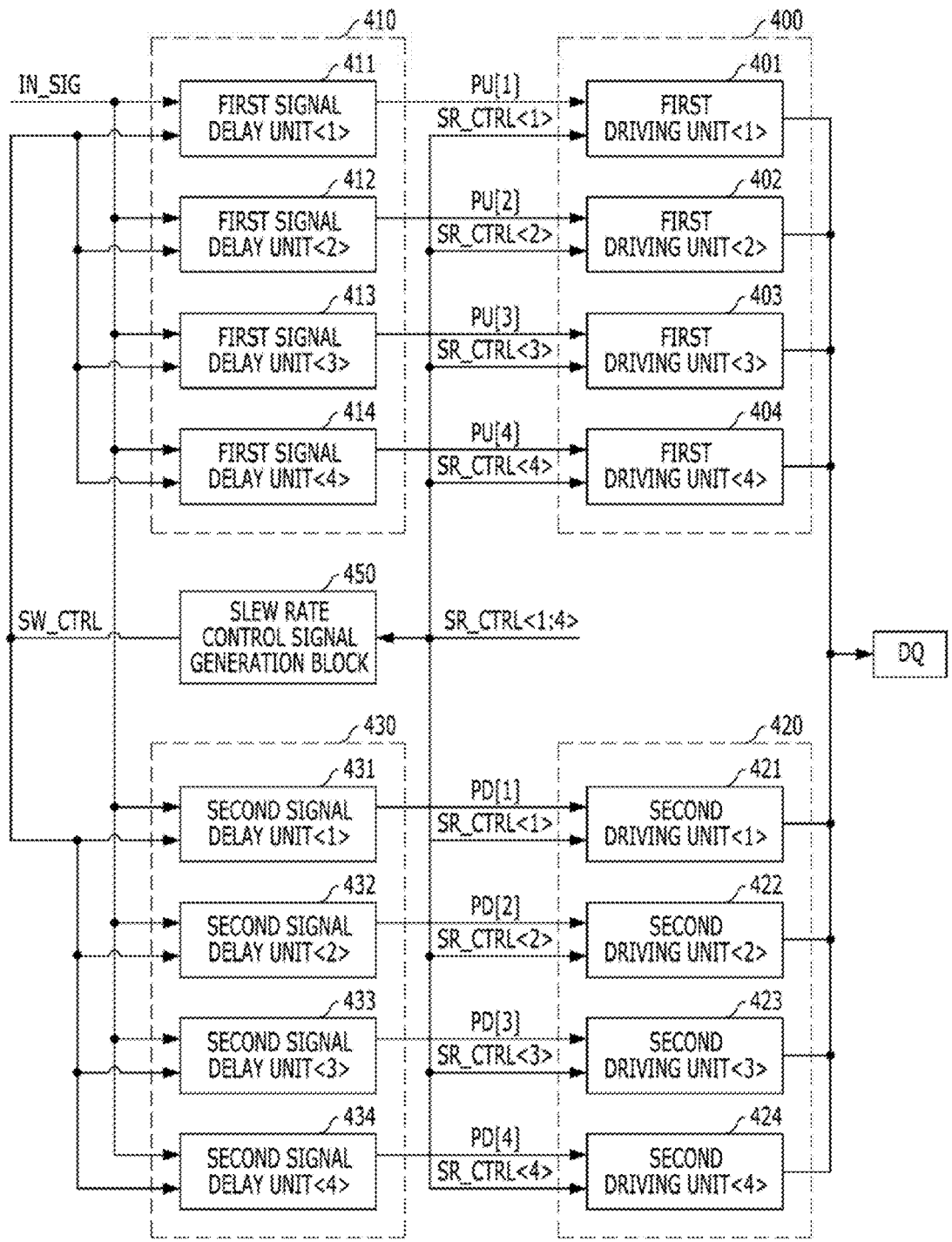
FIG. 4A is a block diagram illustrating a data output circuit of a low-power semiconductor device, in accordance with a second embodiment of the present invention.

FIG. 4A is a block diagram illustrating a data output circuit of a low-power semiconductor device, in accordance with a second embodiment of the present invention.

Referring to FIG. 4A, the data output circuit of the low-power semiconductor device, in accordance with a second embodiment of the present invention, includes a first driving operation block 400, a second driving operation block 420, and slew rate control blocks 410, 430 and 450. The slew rate control blocks 410, 430 and 450 include a first signal delay operation block 410, a second signal delay operation block 430, and a slew rate control signal generation block 450.

The first driving operation block 400 is configured to drive an output node DQ to a logic high level, corresponding to a power supply voltage (VDD), based on logic high levels of inputted signals PU[1:4], or drive the output node DQ to a logic low level, corresponding to a ground voltage (VSS), based on logic low levels of the inputted signals PU[1:4]. Also, the second driving operation block 420 is configured to drive the output node DQ to the logic low level, corresponding to the ground voltage (VSS), based on the logic low levels of the inputted signals PD[1:4], or drive the output node DQ to the logic high level, corresponding to the power supply voltage (VDD), based on the logic high levels of the inputted signals PD[1:4]. The first driving operation block 400 and the second driving operation block operate in opposite ways to each other.

For example, when the first driving operation block 400 pull-up drives the output node DQ to the logic high level, corresponding to the power supply voltage (VDD), based on the logic high levels of the inputted signals PU[1:4] and does not perform any operation based on the logic low levels of the inputted signals PU[1:4], the second driving operation block 420 pull-down drives the output node DQ to the logic low level, corresponding to the ground voltage (VSS), based on the logic low levels of the inputted signals PD[1:4] and does not perform any operation based on the logic high levels of the inputted signals PD[1:4].

Conversely, when the first driving operation block 400 pull-down drives the output node DQ to the logic low level, corresponding to the ground voltage (VSS), based on the logic low levels of the inputted signals PU[1:4] and does not perform any operation based on the logic high levels of the inputted signals PU[1:4], the second driving operation block 420 pull-up drives the output node DQ to the logic high level, corresponding to the power supply voltage (VDD), based on the logic high levels of the inputted signals PD[1:4] and does not perform any operation based on the logic low levels of the inputted signals PD[1:4].

The first driving operation block 400 includes a plurality of first driving units 401, 402, 403 and 404. The plurality of first driving units 401, 402, 403 and 404 are configured to drive the output node DQ based on the inputted signals PU[1:4], and operations of the plurality of the first driving units 401, 402, 403 and 404 are on/off controlled based on driving force control codes SR_CTRL<1:4>. For reference, while it is exemplified in the drawing for the sake of convenience in explanation that a first driving unit<1> 401, a first driving unit<2> 402, a first driving unit<3> 403 and a first driving unit<4> 404 are included in the first driving operation block 400, configuration may be actually made such that an increased or decreased number of the first driving units may be included in the first driving operation block 400. Also, while it is exemplified that the driving force control codes SR_CTRL<1:4> are a signal which is constituted by 4 bits, it is to be noted that driving force control codes may actually be a signal which is constituted by an increased or decreased number of bits.

The second driving operation block 420 includes a plurality of second driving units 421, 422, 423 and 424. The plurality of second driving units 421, 422, 423 and 424 are configured to drive the output node DQ based on the inputted signals PD[1:4], and operations of the plurality of second driving units 421, 422, 423 and 424 are on/off controlled based on the driving force control codes SR_CTRL<1:4>. For reference, while it is exemplified in the drawing for the sake of convenience in explanation that a second driving unit<1> 421, a second driving unit<2> 422, a second driving unit<3> 423 and a second driving unit<4> 424 are included in the plurality of second driving units 421, 422, 423 and 424, configuration may be actually made such that an increased or decreased number of second driving units may be included in the plurality of second driving units 421, 422, 423 and 424. Also, while it is exemplified that the driving force control codes SR_CTRL<1:4> are a signal which is constituted by 4 bits, it is to be noted that driving force control codes may actually be a signal which is constituted by an increased or decreased number of bits.

The reason why the plurality of first driving units 401, 402, 403 and 404 are included in the first driving operation block 400 and the plurality of second driving units 421, 422, 423 and 424 are included in the second driving operation block 420 as in the above-described configuration resides in that, because the semiconductor device in accordance with the second embodiment of the present invention is a low-power semiconductor device, a separate termination control circuit such as an ODT circuit may not be included. That is to say, instead of controlling the impedance matching of the output node DQ through a separate termination control circuit such as an ODT circuit, the impedance matching of the output node DQ is controlled through a scheme of controlling the driving force of an output driver. As a scheme for controlling the driving forces of the first driving operation block 400 and the second driving operation block 420, a method of controlling the value of the driving force control codes SR_CTRL<1:4> is used as exemplified in the following descriptions. The values of the driving force control codes SR_CTRL<1:4> may be defined in advance through an operation setting circuit in the semiconductor device, such as a memory register set (MRS), or by receiving values from an outside of the semiconductor device.

For example, it is assumed that output impedance of the output node DQ in view of single driving unit included in the first driving operation block 400 and the second driving operation block 420 is 120Ω, when only the first bit of the driving force control code SR_CTRL<1> is activated and the second to fourth bits of the driving force control code SR_CTRL<2:4> are deactivated and thus only the driving units 401 and 421 operate and the remaining driving units 402, 403, 404, 422, 423 and 424 do not operate, the output impedance of the output node DQ becomes 120Ω. When only the first and second bits of the driving force control code SR_CTRL<1:2> are activated and the third and fourth bits of the driving force control code SR_CTRL<3:4> are deactivated among the driving force control codes SR_CTRL<1:4>, and thus only the first driving unit<1> 401, the first driving unit<2> 402, the second driving unit<1> 421 and the second driving unit<2> 422 operate, and the first driving unit<3> 403 and the first driving unit<4> 404 and the second driving unit<3> 423 and the second driving unit<4> 424 do not operate, the output impedance of the output node DQ becomes 60Ω. When only the first to third bits of the driving force control code SR_CTRL<1:3> are activated and the fourth bit of the driving force control code SR_CTRL<4> is deactivated and thus the first driving unit<1> to the first driving unit<3> 401, 402 and 403 and the second driving unit<1> to the second driving unit<3> 421, 422 and 423 operate and the first driving unit<4> 404 and the second driving unit<4> 424 do not operate, the output impedance of the output node DQ becomes 40Ω. When all the bits of the driving force control codes SR_CTRL<1:4> are activated, and thus all the first driving units 401, 402, 403 and 404 and the second driving units 421, 422, 423 and 434 operate, the output impedance of the output node DQ becomes 30Ω. For reference, in the above descriptions, output impedance of the output node DQ in view of single driving unit may have a different value according to a design.

The slew rate control blocks 410, 430 and 450 are configured to control the slew rate of a signal which is loaded on the output node DQ, based on the driving force control codes SR_CTRL<1:4>. In other words, the slew rate control blocks 410, 430 and 450 control the slew rate of an input signal IN_SIG based on the driving force control codes SR_CTRL<1:4> and transfer the signals PU[1:4] and PD[1:4] to the first driving operation block 400 and the second driving operation block 420, thereby controlling the slew rate of the signal which is loaded on the output node DQ, through the first driving operation block 400 and the second driving operation block 420.

The slew rate control signal generation block 450 among the components of the slew rate control blocks 410, 430 and 450 is configured to generate a slew rate control signal SW_CTRL based on the driving force control codes SR_CTRL<1:4>.

Schemes for generating the slew rate control signal SW_CTRL based on the value of the driving force control codes SR_CTRL<1:4> in the slew rate control signal generation block 450 may be explained through the following two exemplifications.

A first scheme is the case where it is assumed that the slew rate control signal SW_CTRL outputted from the slew rate control signal generation block 450 is a signal which is constituted by one bit. In this case, when the number of bits activated among the driving force control codes SR_CTRL<1:4> is equal to or larger than a preset number, the slew rate control signal SW_CTRL is outputted by being activated. Conversely, when the number of bits activated among the driving force control codes SR_CTRL<1:4> is smaller than the preset number, the slew rate control signal SW_CTRL is outputted by being deactivated.

For example, assuming that the preset number is 2, when the driving force control codes SR_CTRL<1:4> are '1000', '0100', '0010' or '0001' such that the number of bits activated among the driving force control codes SR_CTRL<1:4> is smaller than 2, the slew rate control signal SW_CTRL may be outputted by being deactivated, and, when the driving force control codes SR_CTRL<1:4> are '1100', '0110', '0011', '1001', '1010', '0101', '1110', '0111', '1011', '1101', '0111' or '1111' such that the number of bits activated among the driving force control codes SR_CTRL<1:4> is equal to or larger than 2, the slew rate control signal SW_CTRL may be outputted by being activated.

A second scheme is the case where it is assumed that the slew rate control signal SW_CTRL outputted from the slew rate control signal generation block 450 is a signal which is constituted by a plurality of bits. In this case, the more the number of bits activated among the driving force control codes SR_CTRL<1:4> increases, the more the slew rate control signal SW_CTRL is outputted by being increased in its value. Conversely, the more the number of bits activated among the driving force control codes SR_CTRL<1:4> decreases, the more the slew rate control signal SW_CTRL is outputted by being decreased in its value.

For example, setting is made such that the value of the driving force control codes SR_CTRL<1:4> when the driving force control codes SR_CTRL<1:4> are '0101' is larger than the value of the driving force control codes SR_CTRL<1:4> when the driving force control codes SR_CTRL<1:4> are '0001', and the value of the driving force control codes SR_CTRL<1:4> when the driving force control codes SR_CTRL<1:4> are '1110' is larger than the value of the driving force control codes SR_CTRL<1:4> when the driving force control codes SR_CTRL<1:4> are '0101'.

In this way, while the concrete schemes may be changed according to whether the slew rate control signal SW_CTRL outputted from the slew rate control signal generation block 450 is a signal which is constituted by one bit or a signal which is constituted by a plurality of bits, the two schemes are the same with each other in that the value of the slew rate control signal SW_CTRL is controlled based on the value of the driving force control codes SR_CTRL<1:4>. In this regard, since the configuration for generating the slew rate control signal SW_CTRL according to the first scheme is easier and simpler to explain than the second scheme, the following descriptions will be made on the assumption that the slew rate control signal SW_CTRL is a signal which is constituted by one bit.

The first signal delay operation block 410 among the components of the slew rate control blocks 410, 430 and 450 includes a plurality of first signal delay units 411, 412, 413 and 414. The plurality of first signal delay units 411, 412, 413 and 414 are configured to delay the input signal IN_SIG by different delay amounts and transfer the signals PU[1:4] to the plurality of first driving units 401, 402, 403 and 404. The plurality of first signal delay units 411, 412, 413 and 414 are controlled in their delay amounts based on the slew rate control signal SW_CTRL.

The delaying the input signal IN_SIG by different delay amounts and then transferring the signals PU[1:4] to the plurality of first driving units 401, 402, 403 and 404 means, for example, that the signal PU[1] transferred to the first driving unit<1> 401 among the plurality of first driving units 401, 402, 403 and 404 is less delayed than the signal PU[2] transferred to the first driving unit<2> 402, the signal PU[2] transferred to the first driving unit<2> 402 is less delayed than the signal PU[3] transferred to the first driving unit<3> 403, and the signal PU[3] transferred to the first driving unit<3> 403 is less delayed than the signal PU[4] transferred to the first driving unit<4> 404.

The more a difference among the delay amounts of the signals PU[1:4] respectively transferred to the plurality of first driving units 401, 402, 403 and 404 is large, the more the slew rate of the signal which is loaded on the output node DQ by the plurality of first driving units 401, 402, 403 and 404 decreases. Conversely, the more a difference among the delay amounts of the signals PU[1:4] respectively transferred to the plurality of first driving units 401, 402, 403 and 404 is small, the more the slew rate of the signal which is loaded on the output node DQ by the plurality of first driving units 401, 402, 403 and 404 increases. For reference, the fact that the slew rate of the signal which is loaded on the output node DQ decreases means that the slope of the signal which is loaded on the output node DQ becomes relatively gentle. Conversely, the fact that the slew rate of the signal which is loaded on the output node DQ increases means that the slope of the signal which is loaded on the output node DQ becomes relatively steep.

The second signal delay operation block 430 among the components of the slew rate control blocks 410, 430 and 450 includes a plurality of second signal delay units 431, 432, 433 and 434. The plurality of second signal delay units 431, 432, 433 and 434 are configured to delay the input signal IN_SIG by different delay amounts and transfer the signals PD[1:4] to the plurality of second driving units 421, 422, 423 and 424.

The plurality of second signal delay units 431, 432, 433 and 434 are controlled in their delay amounts based on the slew rate control signal SW_CTRL.

The applying the input signal IN_SIG by different delay amounts and then transferring the signals PD[1:4] to the plurality of second driving units 421, 422, 423 and 424 means, for example, that the signal PD[1] transferred to the second driving unit<1> 421 among the plurality of second driving units 421, 422, 423 and 424 is less delayed than the signal PD[2] transferred to the second driving unit<2> 422, the signal PD[2] transferred to the second driving unit<2> 422 is less delayed than the signal PD[3] transferred to the second driving unit<3> 423, and the signal PD[3] transferred to the second driving unit<3> 423 is less delayed than the signal PD[4]transferred to the second driving unit<4> 424.

The more a difference among the delay amounts of the signals PD[1:4] respectively transferred to the plurality of second driving units 421, 422, 423 and 424 is large, the more the slew rate of the signal which is loaded on the output node DQ by the plurality of second driving units 421, 422, 423 and 424 decreases. Conversely, the more a difference among the delay amounts of the signals PD[1:4] respectively transferred to the plurality of second driving units 421, 422, 423 and 424 is small, the more the slew rate of the signal which is loaded on the output node DQ by the plurality of second driving units 421, 422, 423 and 424 increases. For reference, the fact that the slew rate of the signal which is loaded on the output node DQ decreases means that the slope of the signal which is loaded on the output node DQ becomes relatively gentle. Conversely, the fact that the slew rate of the signal which is loaded on the output node DQ increases means that the slope of the signal which is loaded on the output node DQ becomes relatively steep.

The reason why the plurality of first signal delay units 411, 412, 413 and 414 are included in the first signal delay operation block 410 and the plurality of second signal delay units 431, 432, 433 and 434 are included in the second signal delay operation block 430 as in the above-described configuration is because the plurality of first driving units 401, 402, 403 and 404 are included in the first driving operation block 400 and the plurality of second driving units 421, 422, 423 and 424 are included in the second driving operation block 420. Namely, in order to delay the input signal IN_SIG by the different delay amounts and transfer the signals PU[1:4] to the plurality of first driving units 401, 402, 403 and 404, the same number of the plurality of first signal delay units 411, 412, 413 and 414 as the plurality of first driving units 401, 402, 403 and 404 should be included, and, in order to delay the input signal IN_SIG by the different delay amounts and transfer the signals PD[1:4] to the plurality of second driving units 421, 422, 423 and 424, the same number of the plurality of second signal delay units 431, 432, 433 and 434 as the plurality of second driving units 421, 422, 423 and 424 should be included. Therefore, if each of the number of the plurality of first driving units 401, 402, 403 and 404 included in the first driving operation block 400 and the number of the plurality of second driving units 421, 422, 423 and 424 included in the second driving operation block 420 is larger or smaller than 4 unlike illustration of the drawing, each of the number of the plurality of first signal delay units 411, 412, 413 and 414 included in the first signal delay operation block 410 and the number of the plurality of second signal delay units 431, 432, 433 and 434 included in the second signal delay operation block 430 should be larger or smaller than 4 in correspondence to each of the number of the plurality of first driving units 401, 402, 403 and 404 and the number of the plurality of second driving units 421, 422, 423 and 424.

In summary, when the number of bits which are activated among the driving force control codes SR_CTRL<1:4> is relatively large and thus, the number of first driving units which perform driving operations, among the plurality of first driving units 401, 402, 403 and 404 included in the first driving operation block 400, is relatively large and the number of second driving units which perform driving operations, among the plurality of second driving units 421, 422, 423 and 424 included in the second driving operation block 420, is relatively large, that is, when each of a driving force by the first driving operation block 400 and a driving force by the second driving operation block 420 is relatively large, the output impedance of the output node DQ becomes relatively low. In such a case, because it may be not necessary to artificially increase the slew rate of the signal which is loaded on the output node DQ, each of a delay amount difference among the signals PU[1:4] respectively transferred to the plurality of first driving units 401, 402, 403 and 404 by the plurality of first signal delay units 411, 412, 413 and 414 and a delay amount difference among the signals PD[1:4] respectively transferred to the plurality of second driving units 421, 422, 423 and 424 by the plurality of second signal delay units 431, 432, 433 and 434 as the slew rate control signal SW_CTRL is activated is retained in a normal state.

However, when the number of bits which are activated among the driving force control codes SR_CTRL<1:4> is relatively small and thus, the number of first driving units which perform driving operations, among the plurality of first driving units 401, 402, 403 and 404 included in the first driving operation block 400, is relatively small and the number of second driving units which perform driving operations, among the plurality of second driving units 421, 422, 423 and 424 included in the second driving operation block 420, is relatively small, that is, when each of a driving force by the first driving operation block 400 and a driving force by the second driving operation block 420 is relatively small, the output impedance of the output node DQ becomes relatively high. In such a case, because it may be necessary to artificially increase the slew rate of the signal which is loaded on the output node DQ, each of a delay amount difference among the signals PU[1:4] respectively transferred to the plurality of first driving units 401, 402, 403 and 404 by the plurality of first signal delay units 411, 412, 413 and 414 and a delay amount difference among the signals PD[1:4] respectively transferred to the plurality of second driving units 421, 422, 423 and 424 by the plurality of second signal delay units 431, 432, 433 and 434 as the slew rate control signal SW_CTRL is deactivated is controlled to a smaller state than the normal state. Thus, the slew rate of the signal which is loaded on the output node DQ is controlled to be higher than the normal state. According to this fact, it may be possible to prevent the occurrence of a phenomenon in which a slope becomes gentle due to ISI among outputted signals, which is caused as the output impedance of the output node DQ increases.

Figure 4B:
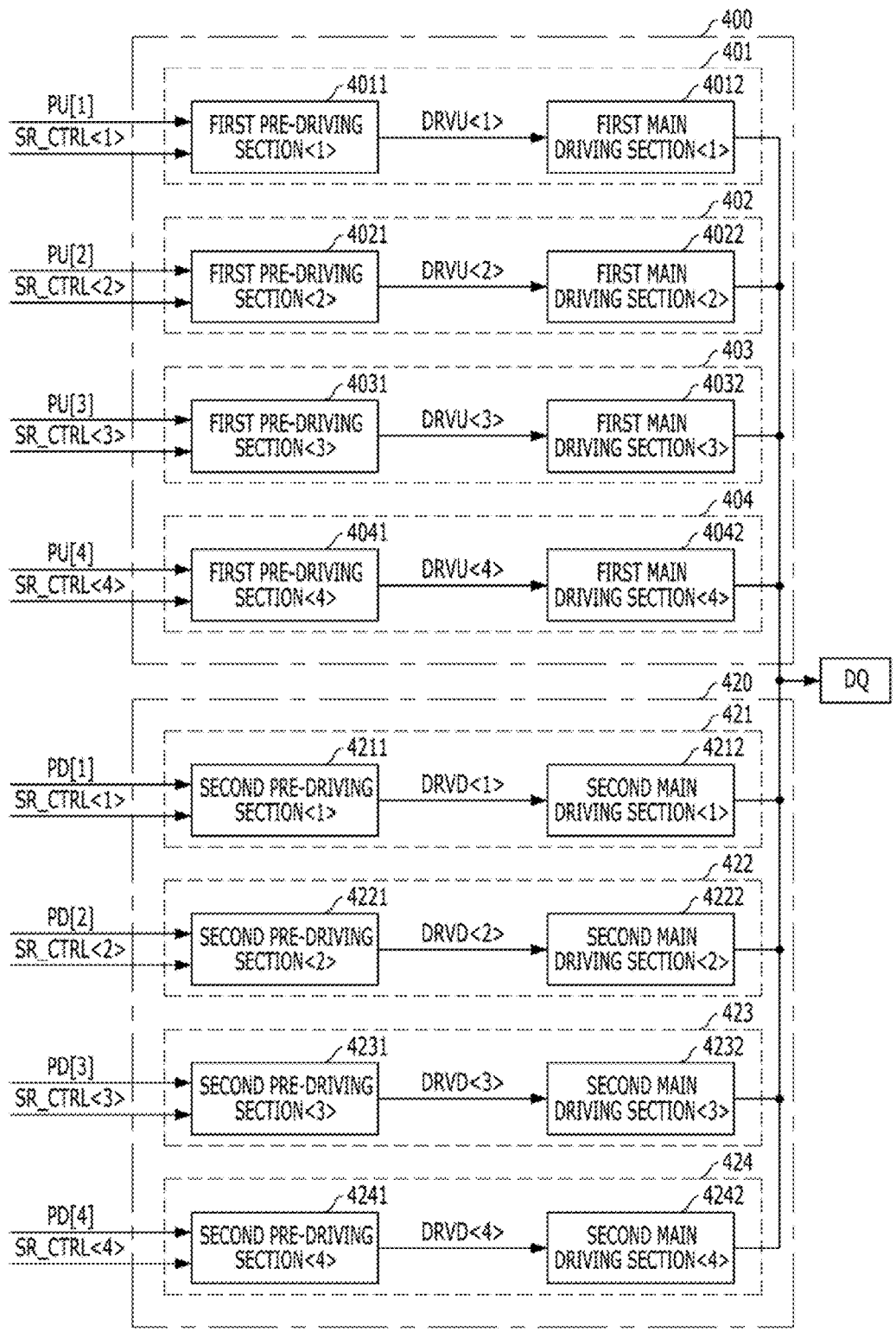
FIGS. 4B and 4C are detailed diagrams illustrating a driving operation block shown in FIG. 4A, respectively.
Figure 4C:
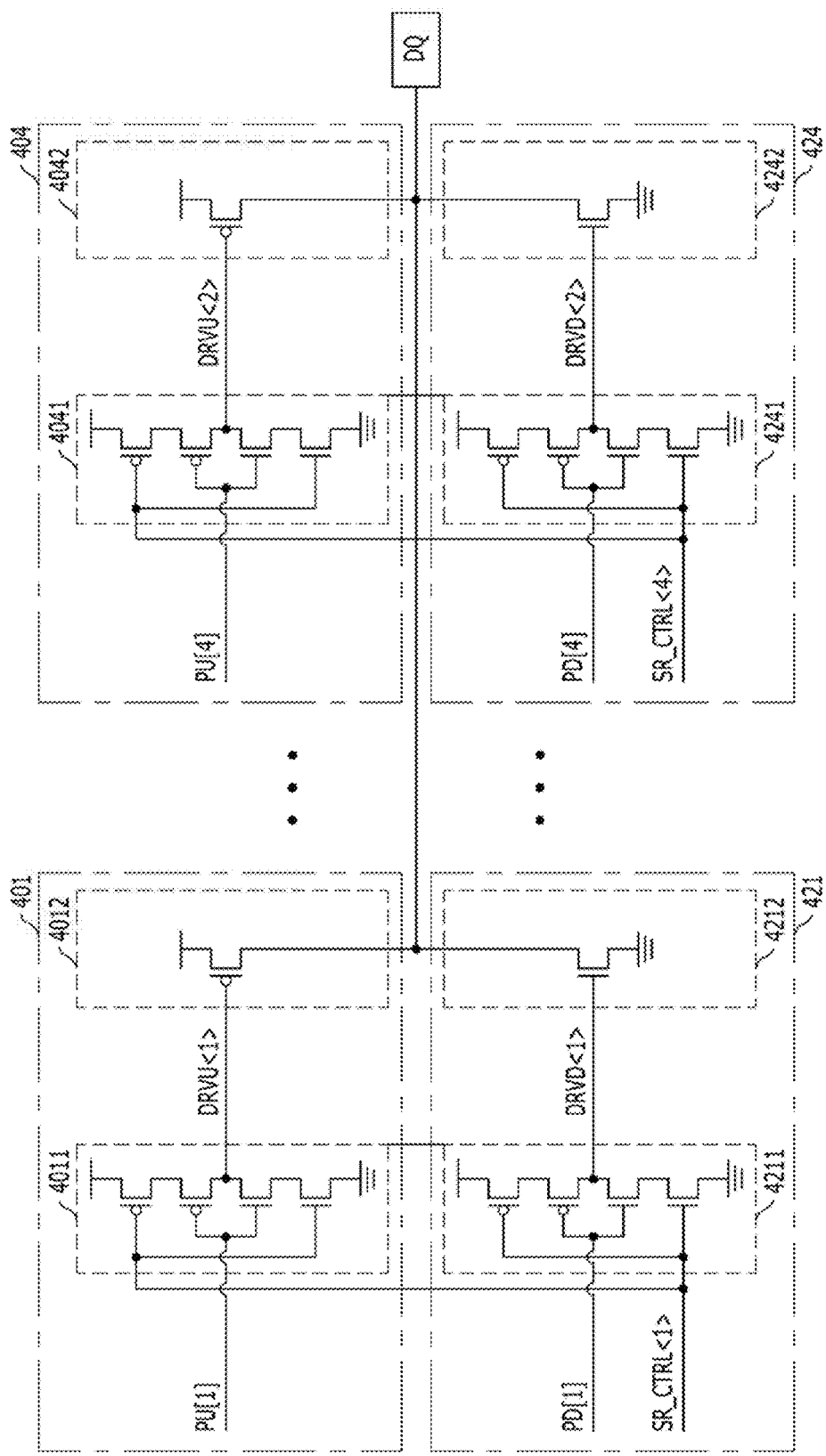

FIGS. 4B and 4C are detailed diagrams illustrating the driving operation block shown in FIG. 4A, respectively.

First, referring to FIG. 4B, FIG. 4B is a block diagram showing the configurations of the plurality of first driving units 401, 402, 403 and 404 included in the first driving operation block 400 and the configurations of the plurality of second driving units 421, 422, 423 and 424 included in the second driving operation block 420, among the components of the data output circuit of a low-power semiconductor device, in accordance with the second embodiment of the present invention.

In detail, the plurality of first driving units 401, 402, 403 and 404 include a plurality of first pre-driving sections 4011, 4021, 4031 and 4041, and a plurality of first main driving sections 4012, 4022, 4032 and 4042. The plurality of first pre-driving sections 4011, 4021, 4031 and 4041 are configured to generate a plurality of first driving control signals DRVU<1:4> based on the delayed input signals PU[1:4] respectively applied through the plurality of first signal delay units 411, 412, 413 and 414 and are on/off controlled in their operations based on the driving force control codes SR_CTRL<1:4>. The plurality of first main driving sections 4012, 4022, 4032 and 4042 are configured to drive the output node DQ based on the plurality of first driving control signals DRVU<1:4>, respectively.

Further, the plurality of second driving units 421, 422, 423 and 424 include a plurality of second pre-driving sections 4211, 4221, 4231 and 4241, and a plurality of second main driving sections 4212, 4222, 4232 and 4242. The plurality of second pre-driving sections 4211, 4221, 4231 and 4241 are configured to generate a plurality of second driving control signals DRVD<1:4> based on the delayed input signals PD[1:4] respectively applied through the plurality of second signal delay units 431, 432, 433 and 434 and are on/off controlled in their operations based on the driving force control codes SR_CTRL<1:4>. The plurality of second main driving sections 4212, 4222, 4232 and 4242 are configured to drive the output node DQ based on the plurality of second driving control signals DRVD<1:4>, respectively.

Further, referring to FIG. 4C, FIG. 4C is a detailed circuit diagram showing the configurations of the plurality of first driving units 401, 402, 403 and 404 included in the first driving operation block 400 and the configurations of the plurality of second driving units 421, 422, 423 and 424 included in the second driving operation block 420, among the components of the data output circuit of a low-power semiconductor device, in accordance with the second embodiment of the present invention. For reference, while FIG. 4C shows a diagram which exemplifies that the first driving operation block 400 pull-up drives the output node DQ and the second driving operation block 420 pull-down drives the output node DQ, it is to be noted that reverse operations may be possible.

In detail, the plurality of first pre-driving sections 4011, 4021, 4031 and 4041 respectively include inverters to output the plurality of first driving control signals DRVU<1:4> with logic low levels based on logic high levels of the plurality of delayed input signals PU[1:4]. Also, the plurality of second pre-driving sections 4211, 4221, 4231 and 4241 respectively include inverters to output the plurality of second driving control signals DRVD<1:4> with logic high levels based on logic low levels of the plurality of delayed input signals PD[1:4]. The inverters respectively included in the plurality of first pre-driving sections 4011, 4021, 4031 and 4041 and the inverters respectively included in the plurality of second pre-driving sections 4211, 4221, 4231 and 4241 are respectively on/off controlled in their operations based on the plurality of driving force control codes SR_CTRL<1:4>.

Further, the plurality of first main driving sections 4012, 4022, 4032 and 4042 respectively include PMOS transistors to drive the output node DQ to the logic high level, corresponding to the power supply voltage (VDD), based on the logic low levels of the plurality of first driving control signals DRVU<1:4>, and the plurality of second main driving sections 4212, 4222, 4232 and 4242 respectively include NMOS transistors to drive the output node DQ to the logic low level, corresponding to the ground voltage (VSS), based on the logic high levels of the plurality of second driving control signals DRVD<1:4>.

Figure 4D:
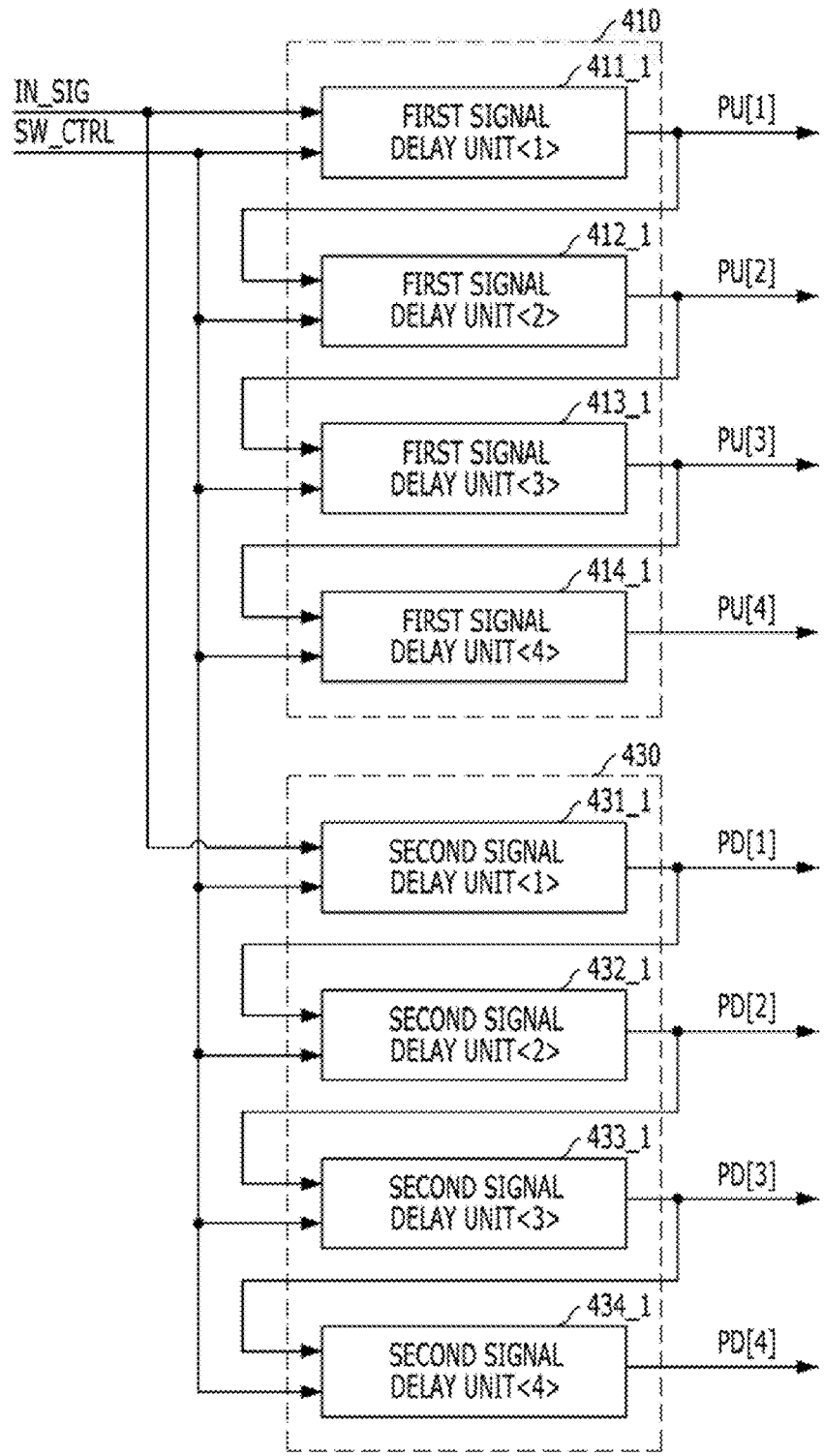
FIG. 4D is a detailed diagram illustrating signal delay operation blocks shown in FIG. 4A.
Figure 4E:
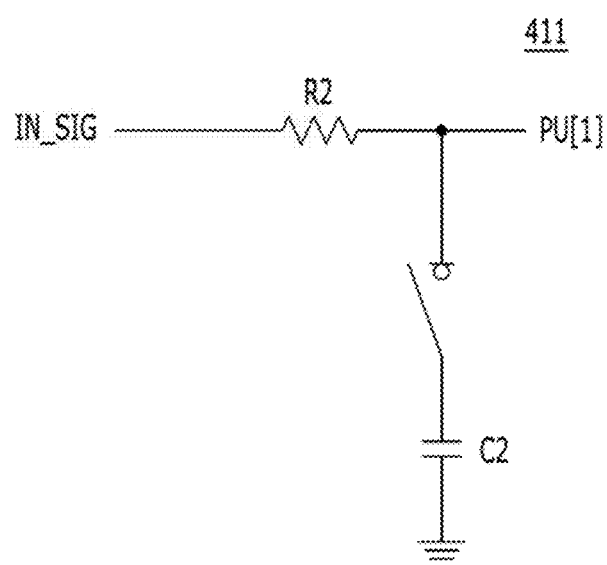
FIG. 4E is a detailed diagram illustrating a single signal delay unit shown in FIGS. 4A and 4D.

FIG. 4D is a block diagram illustrating the signal delay operation block 410 and 430 shown in FIG. 4A, and FIG. 4E is a detailed diagram illustrating a single signal delay unit shown in FIGS. 4A and 4D.

Referring to FIGS. 4A and 4D, two configurations of the plurality of first signal delay units included in the first signal delay operation block 410 among the components of the data output circuit are different from each other. Further, two configurations of the plurality of second signal delay units included in the second signal delay operation block 430 are different from each other.

First, the plurality of first signal delay units 411, 412, 413 and 414 shown in FIG. 4A are configured to receive in parallel and delay the input signal IN_SIG, transfer the signals PU[1:4] to the plurality of first driving units 401, 402, 403 and 404, and be controlled in their delay amounts based on the slew rate control signal SW_CTRL. In the same manner, the plurality of second signal delay units 431, 432, 433 and 434 are configured to receive in parallel and delay the input signal IN_SIG, transfer the signals PD[1:4] to the plurality of second driving units 421, 422, 423 and 424, and be controlled in their delay amounts based on the slew rate control signal SW_CTRL.

Second, the plurality of first signal delay units 411_1, 412_1, 413_1 and 414_1 shown in FIG. 4D are connected in series in a preset order and are configured to receive the input signal IN_SIG through the foremost first signal delay unit<1> 411_1, delay the input signal IN_SIG and the signals PU[1:3] in a stepwise manner, transfer the signals PU[1:4] to the plurality of respective first driving units 401, 402, 403 and 404, and be controlled in their delay amounts based on the slew rate control signal SW_CTRL. In the same manner, the plurality of second signal delay units 431_1, 432_1, 433_1 and 434_1 are connected in series in a preset order and are configured to receive the input signal IN_SIG through the foremost second signal delay unit<1> 431_1, delay the input signal IN_SIG and the signals PD[1:3] in a stepwise manner, transfer the signals PD[1:4] to the plurality of respective second driving units 421, 422, 423 and 424, and be controlled in their delay amounts based on the slew rate control signal SW_CTRL.

By using the fact that the connection styles of the plurality of signal delay units are different in this way, the delay amount of the plurality of signal delay units may be differently set.

That is to say, when the plurality of first signal delay units 411, 412, 413 and 414 and the plurality of second signal delay units 431, 432, 433 and 434 are configured as shown in FIG. 4A, only when the plurality of first signal delay units 411, 412, 413 and 414 and the plurality of second signal delay units 431, 432, 433 and 434 are set with delay amounts independently of one another to have different delay amounts, the plurality of delayed input signals PU[1:4] and PD[1:4] may be generated while having an appropriate delay amount difference. For example, if the first signal delay unit<1> 411 and the second signal delay unit<1> 431 are set to have a delay amount of '10 ps', the first signal delay unit<2> to the first signal delay unit<4> 412, 413 and 414 and the second delay unit<2> to the second delay unit<4> 432, 433 and 434 should be set to have a delay amount which is larger or smaller than the delay amount of '10 ps'.

Conversely, when the plurality of signal delay units are configured as shown in FIG. 4D, even though the plurality of first signal delay units 411_1, 412_1, 413_1 and 414_1 and the plurality of second signal delay units 431_1, 432_1, 433_1 and 434_1 have the same delay amount, the plurality of delayed input signals PU[1:4] and PU[1:4] may be generated while having an appropriate delay amount difference. For example, if the first signal delay unit<1> 411_1 and the second signal delay unit<1> 431_1 are set to have a delay amount of '10 ps', the first signal delay unit<2> to the first signal delay unit<4> 412_1, 413_1 and 414_1 and the second delay unit<2> to the second delay unit<4> 432_1, 433_1 and 434_1 may be set to have the delay amount of '10 ps' or a delay amount which is larger or smaller than the delay amount of '10 ps'.

For reference, referring to FIG. 4E, the detailed circuit of each of the plurality of first signal delay units 411, 412, 413 and 414 and the plurality of second signal delay units 431, 432, 433 and 434 shown in FIG. 4A and the plurality of first signal delay units 411_1, 412_1, 413_1 and 414_1 and the plurality of second signal delay units 431_1, 432_1, 433_1 and 434_1 shown in FIG. 4D may be realized through a resistor R2 and a capacitor C2. Moreover, an operation of changing the delay amount of the plurality of first signal delay units and the plurality of second signal delay units based on the slew rate control signal SW_CTRL may be realized through a simple switch circuit SW2 such as a fuse or a MOS transistor. Since the configuration of FIG. 4E is generally known in the art, detailed descriptions thereof will be omitted herein.

As is apparent from the above descriptions, in the embodiments of the present invention, the slew rate of the output signal may be controlled based on the driving force control codes SR_CTRL<1:4> for controlling the driving force of the output signal even in the low-power semiconductor device without a separate termination control circuit such as an ODT circuit, whereby it may be possible to secure a data eye. That is, the reliability of an output signal may be significantly improved.

As a consequence, in the low-power semiconductor device without a separate termination control circuit such as an ODT circuit, because a data eye may be stably secured even though output impedance increases to a relatively large value, an impedance matching operation may be performed over a wide range.

Although various embodiments have been described for illustrative purposes, it will be apparent to those skilled in the art that various changes and modifications may be made without departing from the spirit and scope of the invention as defined in the following claims.

For example, the positions and kinds of the logic gates and the transistors exemplified in the aforementioned embodiments may be realized in different ways according to the polarities of related signals.

What is claimed is:

1. A semiconductor device comprising:
a plurality of driving units configured to drive an output node based on an input signal and be on/off controlled based on driving force control codes, respectively;
a slew rate control signal generation block configured to generate a slew rate control signal based on the driving force control codes; and
a plurality of signal delay units configured to delay the input signal by respectively different delay amounts, transfer resultant signals to the plurality of driving units, and be respectively controlled in their delay amounts based on the slew rate control signal,
wherein the plurality of signal delay units are coupled in series in a preset order, receive the input signal through a foremost signal delay unit, delay the input signal in a stepwise manner, transfer resultant signals to the plurality of respective driving units, and be respectively controlled in their delay amounts based on the slew rate control signal.

2. The semiconductor device according to claim 1, wherein the plurality of signal delay units receive in parallel and respectively delay the input signal, transfer resultant signals to the plurality of driving units, and be respectively controlled in their delay amounts based on the slew rate control signal.

3. The semiconductor device according to claim 1, wherein the slew rate control signal generation block outputs the activated slew rate control signal when the number of activated bits among the driving force control codes is equal to or larger than a preset number, and outputs the deactivated slew rate control signal when the number of activated bits among the driving force control codes is smaller than the preset number.

4. The semiconductor device according to claim 1, wherein the slew rate control signal generation block outputs the slew rate control signal by increasing a value thereof when the number of activated bits among the driving force control codes increases, and outputs the slew rate control signal by decreasing the value thereof when the number of activated bits among the driving force control codes decreases.

5. The semiconductor device according to claim 1, wherein the plurality of driving units comprise:
a plurality of pre-driving sections configured to generate a plurality of driving control signals based on delayed input signals which are respectively applied through the plurality of signal delay units, and be on/off controlled in their operations based on the driving force control codes; and
a plurality of main driving sections configured to drive the output node based on the plurality of driving control signals, respectively.

6. The semiconductor device according to claim 1, wherein the output node is configured to be driven without a termination control circuit.

7. A semiconductor device comprising:
a plurality of first driving units configured to drive an output node based on an input signal with a first logic level, and be on/off controlled based on driving force control codes, respectively;
a plurality of second driving units configured to drive the output node based on the input signal with a second logic level, and be on/off controlled based on the driving force control codes, respectively;
a slew rate control signal generation block configured to generate a slew rate control signal based on the driving force control codes;
a plurality of first signal delay units configured to delay the input signal with the first logic level by respectively different delay amounts, transfer resultant signals to the plurality of first driving units, and be respectively controlled in their delay amounts based on the slew rate control signal; and
a plurality of second signal delay units configured to delay the input signal with the second logic level by respectively different delay amounts, transfer resultant signals to the plurality of second driving units, and be respectively controlled in their delay amounts based on the slew rate control signal.

8. The semiconductor device according to claim 7, wherein the plurality of first signal delay units are coupled in series in a preset order, receive the input signal with the first logic level through a foremost signal delay unit, delay the input signal in a stepwise manner, transfer resultant signals to the plurality of respective first driving units, and be respectively controlled in their delay amounts based on the slew rate control signal, and wherein the plurality of second signal delay units are coupled in series in a preset order, receive the input signal with the second logic level through a foremost signal delay unit, delay the input signal in a stepwise manner, transfer resultant signals to the plurality of respective second driving units, and be respectively controlled in their delay amounts based on the slew rate control signal.

9. The semiconductor device according to claim 7,
wherein the plurality of first signal delay units receive in parallel and respectively delay the input signal with the first logic level, transfer resultant signals to the plurality of first driving units, and be respectively controlled in their delay amounts based on the slew rate control signal, and
wherein the plurality of second signal delay units receive in parallel and respectively delay the input signal with the second logic level, transfer resultant signals to the plurality of second driving units, and be respectively controlled in their delay amounts based on the slew rate control signal.

10. The semiconductor device according to claim 7, wherein the slew rate control signal generation block outputs the activated slew rate control signal when the number of activated bits among the driving force control codes is equal to or larger than a preset number, and outputs the by deactivated slew rate control signal when the number of activated bits among the driving force control codes is smaller than the preset number.

11. The semiconductor device according to claim 7, wherein the slew rate control signal generation block outputs the slew rate control signal by increasing a value thereof when the number of activated bits among the driving force control codes increases, and outputs the slew rate control signal by decreasing the value thereof when the number of activated bits among the driving force control codes decreases.

12. The semiconductor device according to claim 7, wherein the plurality of first driving units comprise:
a plurality of first pre-driving sections configured to generate a plurality of first driving control signals based on delayed input signals with the first logic level which are respectively applied through the plurality of first signal delay units, and be on/off controlled in their operations based on the driving force control codes; and
a plurality of first main driving sections configured to drive the output node based on the plurality of first driving control signals, respectively.

13. The semiconductor device according to claim 12, wherein the plurality of second driving units comprise:
a plurality of second pre-driving sections configured to generate a plurality of second driving control signals based on delayed input signals with the second logic level which are respectively applied through the plurality of second signal delay units, and be on/off controlled in their operations based on the driving force control codes; and
a plurality of second main driving sections configured to drive the output node based on the plurality of second driving control signals, respectively.

14. The semiconductor device according to claim 7, wherein the output node is configured to be driven without a termination control circuit.

15. An operating method of a semiconductor device, comprising:
a slew rate control operation of delaying an input signal by a plurality of different delay amounts, outputting a plurality of delayed input signals, and controlling the plurality of delay amounts based on driving force control codes; and
a driving force control operation of selecting a predetermined number of delayed input signals among the plurality of delayed input signals based on the driving force control codes, and driving an output node in response in parallel to the selected signals,
wherein the driving force control operation comprises:
selecting the predetermined number of delayed input signals with a first logic level among the plurality of delayed input signals with the first logic level, based on the driving force control codes, and pull-up driving the output node in response in parallel to the selected signals; and
selecting the predetermined number of delayed input signals with a second logic level among the plurality of delayed input signals with the second logic level, based on the driving force control codes, and pull-down driving the output node in response in parallel to the selected signals.

16. The method according to claim 15, wherein the slew rate control operation comprises:
generating a slew rate control signal based on the driving force control codes;
sequentially delaying the input signal through a plurality of serial delay stages, outputting the plurality of delayed input signals, and controlling delay amounts of the plurality of serial delay stages based on the slew rate control signal; and
delaying in parallel the input signal through a plurality of parallel delay stages, outputting the plurality of delayed input signals, and controlling delay amounts of the plurality of parallel delay stages based on the slew rate control signal.

17. The method according to claim 16, wherein the generating of the slew rate control signal comprises:
outputting the activated slew rate control signal when the number of activated bits among the driving force control codes is equal to or larger than a preset number; and
outputting the deactivated slew rate control signal when the number of activated bits among the driving force control codes is smaller than the preset number.

18. The method according to claim 16, wherein the generating of the slew rate control signal comprises:
outputting the slew rate control signal by increasing a value thereof when the number of activated bits among the driving force control codes increases; and
outputting the slew rate control signal by decreasing the value thereof when the number of activated bits among the driving force control codes decreases.

* * * * *